United States Patent
Wu et al.

(10) Patent No.: US 6,399,984 B1
(45) Date of Patent: Jun. 4, 2002

(54) SPECIES IMPLANTATION FOR MINIMIZING INTERFACE DEFECT DENSITY IN FLASH MEMORY DEVICES

(75) Inventors: Yider Wu, San Jose; Mark T. Ramsbey, Sunnyvale; Chi Chang, Redwood City; Yu Sun, Saratoga; Tuan Duc Pham, Santa Clara; Jean Y. Yang, Palo Alto, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/882,242

(22) Filed: Jun. 15, 2001

Related U.S. Application Data

(62) Division of application No. 09/609,468, filed on Jul. 3, 2000, now Pat. No. 6,284,600.

(51) Int. Cl.[7] .................................... H01L 29/788

(52) U.S. Cl. ........................ 257/316; 257/314

(58) Field of Search ................ 257/314–316; 438/257–267

(56) References Cited

U.S. PATENT DOCUMENTS

| | | | | |
|---|---|---|---|---|
| 5,837,585 A | * | 11/1998 | Wu et al. | 438/264 |
| 5,937,301 A | * | 8/1999 | Gardner et al. | 438/303 |
| 5,972,751 A | * | 10/1999 | Ramsbey et al. | 438/257 |
| 6,069,041 A | * | 5/2000 | Tanigami et al. | 438/261 |
| 6,188,101 B1 | * | 2/2001 | Wang | 257/314 |

* cited by examiner

*Primary Examiner*—Richard Booth
(74) *Attorney, Agent, or Firm*—Monica H. Choi

(57) ABSTRACT

A predetermined species such as nitrogen is placed at an interface between a bit line junction and a dielectric layer of a control dielectric structure of a flash memory device to minimize degradation of such an interface by minimizing formation of interface defects during program or erase operations of the flash memory device. The predetermined species such as nitrogen is implanted into a bit line junction of the flash memory device. A thermal process is performed that heats up the semiconductor wafer such that the predetermined species such as nitrogen implanted within the semiconductor wafer thermally drifts to the interface between the bit line junction and the control dielectric structure during the thermal process. The predetermined species such as nitrogen at the interface minimizes formation of interface defects and thus degradation of the interface with time during the program or erase operations of the flash memory device.

6 Claims, 3 Drawing Sheets

SPECIES IMPLANTATION FOR MINIMIZING INTERFACE DEFECT DENSITY IN FLASH MEMORY DEVICES

This is a divisional of an earlier filed patent application with Ser. No. 09/609,468 filed on Jul. 3, 2000 now U.S. Pat. No. 6,284,600, for which priority is claimed. This earlier filed copending patent application with Ser. No. 09/609,468 is in its entirety incorporated herewith by reference.

TECHNICAL FIELD

The present invention relates generally to flash memory devices that are electrically programmable and/or erasable, and more particularly, to implanting a predetermined species such as nitrogen such that the predetermined species accumulates at an interface between a bit line junction and a control dielectric structure after a thermal process, for minimizing degradation of such an interface during the program or erase operations of a flash memory device.

BACKGROUND OF THE INVENTION

Referring to FIG. 1, a cell of a prior art flash memory device 100 includes a control gate 102 which typically is comprised of polysilicon. A first bit line junction 104 that is doped with a junction dopant, such as arsenic (As) or phosphorous (P) for example, is formed within a semiconductor substrate 106. A second bit line junction 108 that is doped with the junction dopant is formed within the semiconductor substrate 106.

A control dielectric structure is formed over a control gate area 110 within the semiconductor substrate 106 that is disposed between the first bit line junction 104 and the second bit line junction 108. The control dielectric structure is comprised of a stack of a first dielectric layer 112 disposed on the semiconductor substrate 106, a second dielectric layer 114 disposed on the first dielectric layer 112, and a third dielectric layer 116 disposed on the second dielectric layer 114. In one example of the control dielectric structure, the first dielectric layer 112 is comprised of silicon dioxide (SiO$_2$), the second dielectric layer 114 is comprised of silicon nitride (SiN), and the third dielectric layer 116 is comprised of silicon dioxide (SiO$_2$). A first field oxide 118 is formed within the first bit line junction 104, and a second field oxide 120 is formed within the second bit line junction 108 for electrically isolating the gate dielectric structure comprised of the first, second, and third dielectric layers 112, 114, and 116 and the control gate 102.

During the program or erase operations of the cell of the flash memory device 100 of FIG. 1, charge carriers are injected into or injected out of the second dielectric layer 114. Such variation of the amount of charge carriers within the second dielectric layer 114 alters the threshold voltage of the control gate 102, as known to one of ordinary skill in the art of electronics. For example, when electrons are the charge carriers that are injected into the second dielectric layer 114, the threshold voltage increases. Alternatively, when electrons are the charge carriers that are injected out of the second dielectric layer 114, the threshold voltage decreases. These two conditions are used as the two states for storing digital information within the cell of the flash memory device 100, as known to one of ordinary skill in the art of electronics.

The charge carriers are injected into or injected out of the second dielectric layer 114 from the first bit line junction 104 and/or the second bit line junction 108 through the interface between such junctions 104 and/or 108 and the control dielectric structure when bias voltages are applied on the control gate 102 via a control gate terminal 122, as known to one of ordinary skill in the art of electronics. For example, when a bias voltage of approximately +12 V is applied on the control gate terminal 122, electrons are injected into the second dielectric layer 114 from the first bit line junction 104 and/or the second bit line junction 108 through the interface between such junctions 104 and/or 108 and the control dielectric structure by hot carrier injection effect, as known to one of ordinary skill in the art of electronics. Alternatively, when a bias voltage of approximately −12 V is applied on the control gate terminal 122, electrons are injected out of the second dielectric layer 114 and to the first bit line junction 104 and/or the second bit line junction 108 through the interface between such junctions 104 and/or 108 and the control dielectric structure by hot carrier injection effect, as known to one of ordinary skill in the art of electronics.

With such hot carrier injection effect, the charge carriers are injected through the interface between the first bit line junction 104 and the first dielectric layer 112 of the control dielectric structure or through the interface between the second bit line junction 108 and the first dielectric layer 112 of the control dielectric structure. Because charge carriers are injected back and forth through these interfaces in accordance with hot carrier injection effect, such interfaces are prone to develop higher interface defect density with time, as known to one of ordinary skill in the art of electronics. Such interface defects degrade the reliability of the cell of the flash memory device 100 of FIG. 1 because less charge carriers may be injected through such interfaces as higher interface defect density develops with time, as known to one of ordinary skill in the art of electronics.

In addition, with such higher interface defect density, the second dielectric layer 114 may not retain the charge carriers injected therein for a long period of time, as known to one of ordinary skill in the art of electronics. However, if the cell of the flash memory device 100 is part of a static memory device, retention of charge carriers by the second dielectric layer 114 for a relatively long period of time (up to ten years for example) may be the industry standard.

Thus, minimization is desired of interface defect density that may develop from hot carrier injection through the interface between a bit line junction and a dielectric layer of a control dielectric structure of a flash memory device.

SUMMARY OF THE INVENTION

Accordingly, in a general aspect of the present invention, a predetermined species such as nitrogen is placed at an interface between a bit line junction and a dielectric layer of a control dielectric structure of a flash memory device to minimize degradation of such an interface by minimizing formation of interface defects during program or erase operations of the flash memory device.

A semiconductor wafer having a control dielectric stack thereon is patterned to expose a bit line area and to mask a control gate area of the semiconductor wafer. A junction dopant is implanted into the exposed bit line area to form the bit line junction in the bit line area of the semiconductor wafer. A predetermined species such as nitrogen is also implanted into the exposed bit line area. The control dielectric stack is patterned such that the control dielectric stack is removed from the exposed bit line area and such that the control dielectric stack remains at the control gate area to form the control dielectric structure. A thermal process is performed that heats up the semiconductor wafer. The bit line junction extends under the control dielectric structure from thermal diffusion of the junction dopant to form the interface between the bit line junction and the control dielectric structure. In addition, the predetermined species such as nitrogen implanted within the semiconductor wafer thermally drifts to the interface between the bit line junction and the control dielectric structure during the thermal process.

The predetermined species such as nitrogen that is placed towards the interface between the bit line junction and the control dielectric structure minimizes interface defect density and thus degradation of the interface with time during program or erase operations of the flash memory device.

In one embodiment of the present invention, the junction dopant may be implanted into the exposed bit line area at an angle to ensure that the bit line junction extends under the control dielectric structure. In addition, the predetermined species such as nitrogen may be implanted into the exposed bit line area at an angle to ensure that the predetermined species thermally drifts to the interface between the bit line junction and the control dielectric structure.

The present invention may be used to particular advantage when the control dielectric stack is comprised of a first silicon dioxide ($SiO_2$) layer on the semiconductor wafer, a silicon nitride (SiN) layer on the first silicon dioxide ($SiO_2$) layer, and a second silicon dioxide ($SiO_2$) layer on the silicon nitride (SiN) layer, when the junction dopant is comprised of arsenic (As) or phosphorous (P), and when the thermal process is for forming a field oxide at the bit line area to electrically isolate the control dielectric structure.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, and 8 refer to elements having similar structure and function.

DETAILED DESCRIPTION

Figure 1:
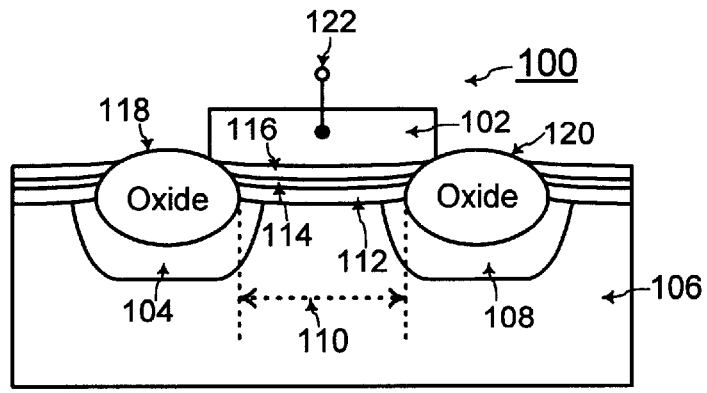
FIG. 1 shows a cross sectional view of components of a cell of a flash memory device, according to the prior art.
Figure 2:
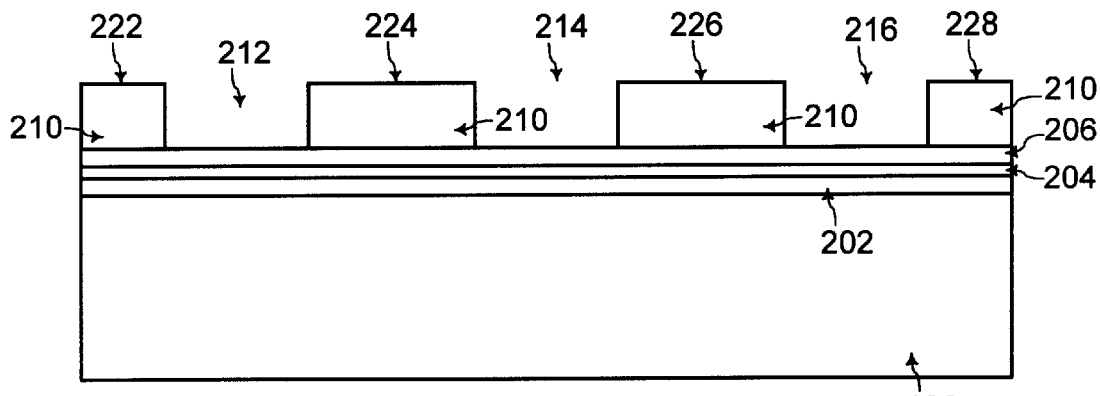
FIGS. 2, 3, 4, 5, 6, 7, and 8 illustrate cross sectional views of the steps for placing a predetermined species such as nitrogen towards an interface between a bit line junction and a dielectric layer of a control dielectric structure of a flash memory device to minimize degradation of such an interface by minimizing interface defect density during program or erase operations of the flash memory device, according to an embodiment of the present invention.

Referring to FIG. 2, a control dielectric stack is deposited on the semiconductor wafer 106. The control dielectric stack includes a first dielectric layer 202 formed on the semiconductor wafer 106, a second dielectric layer 204 formed on the first dielectric layer 202, and a third dielectric layer 206 formed on the second dielectric layer 204. In one embodiment of the present invention, the first dielectric layer 202 is comprised of silicon dioxide ($SiO_2$), the second dielectric layer 204 is comprised of silicon nitride (SiN), and the third dielectric layer 206 is comprised of silicon dioxide ($SiO_2$). Processes for depositing such dielectric layers are known to one of ordinary skill in the art of integrated circuit fabrication.

Further referring to FIG. 2, a photoresist layer 210 is patterned on the semiconductor wafer 106 to expose bit line areas including a first bit line area 212, a second bit line area 214, and a third bit line area 216. The photoresist layer 210 masks the semiconductor wafer 106 at a plurality of control gate areas including a first control gate area 222, a second control gate area 224, a third control gate area 226, and a fourth control gate area 228. Each of these control gate areas 222, 224, 226, and 228 define an area for formation of a respective control gate thereon for a respective cell of a flash memory device. An array of cells of a flash memory device has more numerous control gates, but four control gate areas 222, 224, 226, and 228 are illustrated in FIG. 2 for clarity of illustration.

Figure 3:
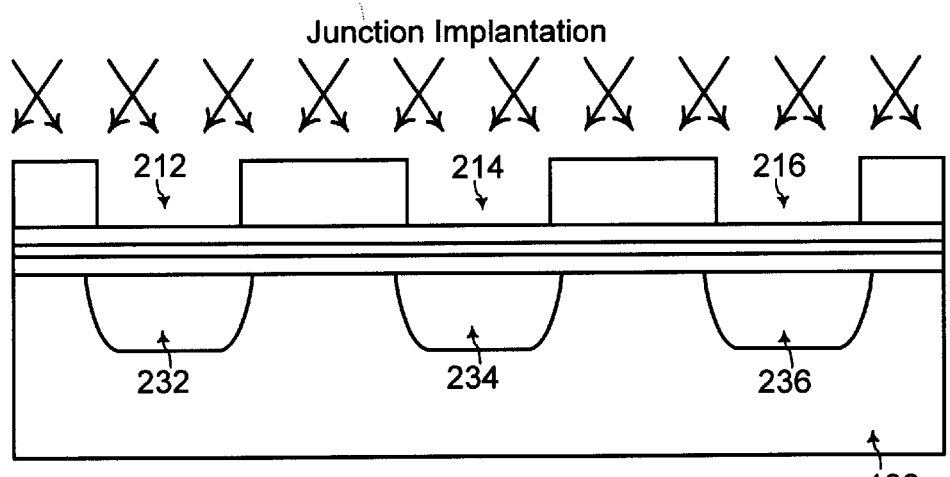

Referring to FIG. 3, a junction dopant is implanted into the exposed bit line areas 212, 214, and 216 to form a first bit line junction 232 within the first bit line area 212 of the semiconductor wafer 106, a second bit line junction 234 within the second bit line area 214 of the semiconductor wafer 106, and a third bit line junction 236 within the third bit line area 216 of the semiconductor wafer 106. The junction dopant may be arsenic (As) or phosphorous (P) for example in one embodiment of the present invention. The junction dopant may also be implanted at an angle in one embodiment of the present invention to ensure that the bit line junctions extend under the control gate areas 222, 224, 226, and 228. Angled implantation processes are known to one of ordinary skill in the art of integrated circuit fabrication.

Figure 4:
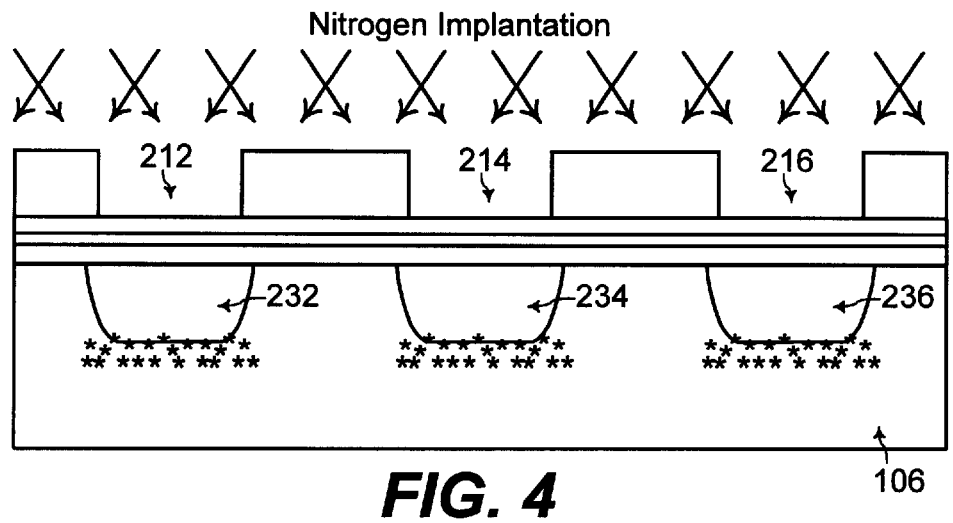

Referring to FIG. 4, a predetermined species such as nitrogen is implanted into the exposed bit line areas 212, 214, and 216 of the semiconductor wafer 106. The presence of the predetermined species within the semiconductor wafer 106 is illustrated by the "*" character in FIGS. 4, 5, 6, 7, and 8. The predetermined species may also be implanted at an angle in one embodiment of the present invention to ensure that the predetermined species extends under the control gate areas 222, 224, 226, and 228. In one embodiment of the present invention, nitrogen is implanted as the predetermined species into the exposed bit line areas 212, 214, and 216 of the semiconductor wafer 106 with a concentration in a range of from about $3 \times 10^{20}$ per $cm^3$ to about $2 \times 10^{21}$ per $cm^3$.

Angled implantation processes are known to one of ordinary skill in the art of integrated circuit fabrication. Implantation processes for incorporation of the predetermined species such as nitrogen into the exposed bit line areas 212, 214, and 216 is preferred to diffusion processes because the concentration of the predetermined species such as nitrogen is more controllable with implantation processes and because a higher concentration of the predetermined species such as nitrogen may be attained with implantation processes.

Figure 5:
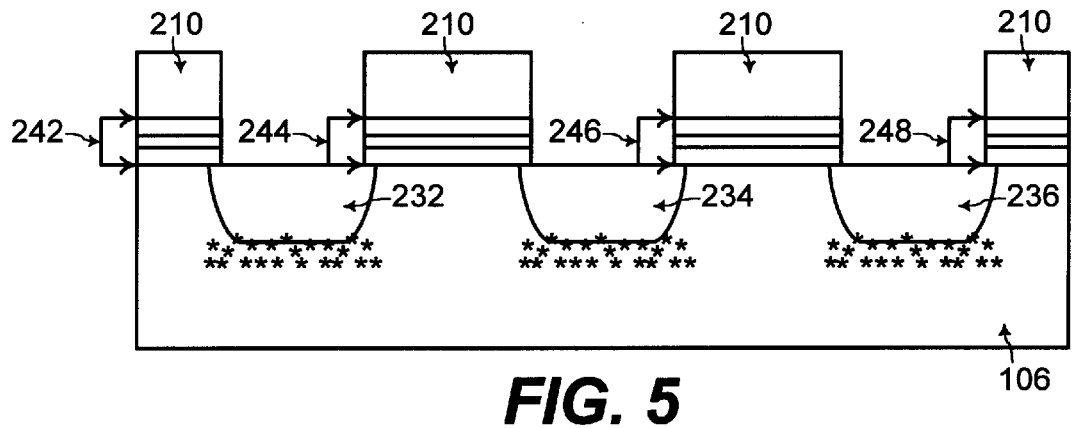

Referring to FIGS. 2 and 5, the control dielectric stack, comprised of the first dielectric layer 202 formed on the semiconductor wafer 106, the second dielectric layer 204 formed on the first dielectric layer 202, and the third dielectric layer 206 formed on the second dielectric layer 204, is patterned by the photoresist layer 210 such that the control dielectric stack is removed from the exposed bit line areas 212, 214, and 216 and such that the control dielectric stack remains at the control gate areas 222, 224, 226, and 228. The control dielectric stack that remains at the control gate areas 222, 224, 226, and 228 forms control dielectric structures including a first control dielectric structure 242 at the first control gate area 222, a second control dielectric structure 244 at the second control gate area 224, a third control dielectric structure 246 at the third control gate area 226, and a fourth control dielectric structure 248 at the fourth control gate area 228.

Figure 6:
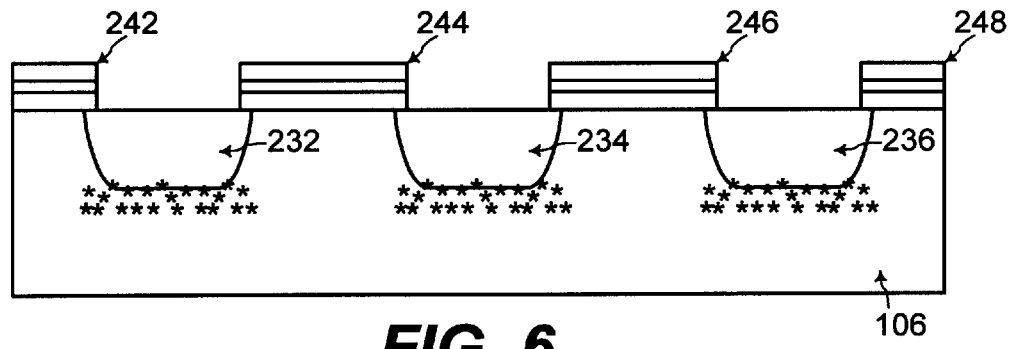

Referring to FIG. 6, the photoresist layer 210 is removed from the first control dielectric structure 242, the second control dielectric structure 244, the third control dielectric structure 246, and the fourth control dielectric structure 248. Such patterning and etching processes are known to one of ordinary skill in the art of integrated circuit fabrication.

Figure 7:
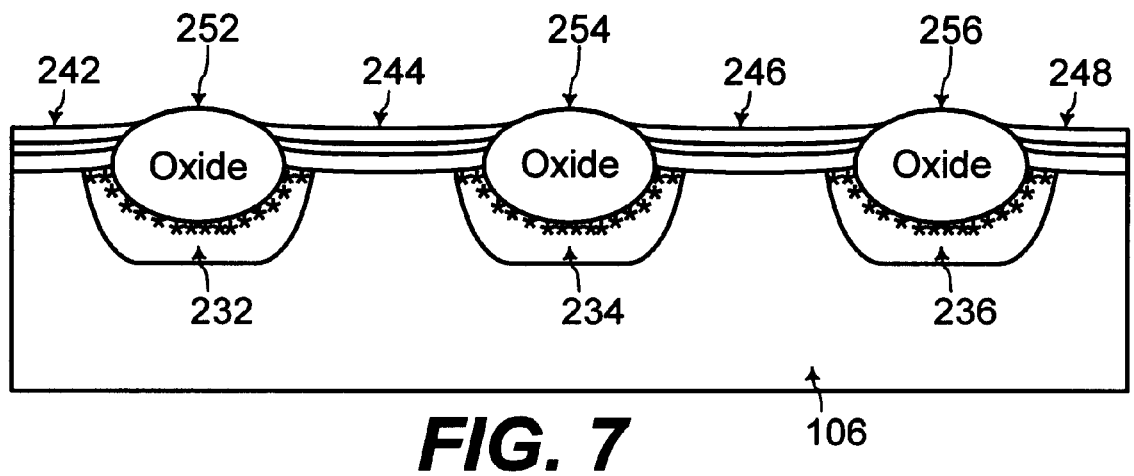

Referring to FIG. 7, a first field oxide 252 is formed from the surface within the first bit line junction 232, a second field oxide 254 is formed from the surface within the second bit line junction 234, and a third field oxide 256 is formed from the surface within the third bit line junction 236, using a thermal process of heating up the semiconductor wafer 106 to a raised temperature of about 800° Celsius for example in an oxygen ambient. Such thermal processes for formation of field oxide are known to one of ordinary skill in the art of integrated circuit fabrication. The field oxides 252, 254, and 256 electrically isolate the control dielectric structures 242, 244, 246, and 248.

Referring to FIGS. 6 and 7, when the semiconductor wafer 106 is heated to a raised temperature in a thermal process, the bit line junctions 232, 234, and 236 further extend under the control dielectric structures 242, 244, 246, and 248 from thermal diffusion of the junction dopant. Interfaces are formed between the bit line junctions 232, 234, and 236 and the control dielectric structures 242, 244, 246, and 248 at areas where the bit line junctions 232, 234, and 236 extend under the control dielectric structures 242, 244, 246, and 248 In addition, referring to FIGS. 6 and 7, during the thermal process that heats up the semiconductor wafer 106, the predetermined species such as nitrogen that has been implanted within the semiconductor wafer 106 thermally drifts to such interfaces between the bit line junctions 232, 234, and 236 and the control dielectric structures 242, 244, 246, and 248.

The thermal process used for forming the field oxides 252, 254, and 256 is only an example thermal process for heating up the semiconductor wafer 106. Any other thermal process for heating up the semiconductor wafer 106 may be used such that the predetermined species such as nitrogen that has been implanted within the semiconductor wafer 106 thermally drifts to the interfaces between the bit line junctions 232, 234, and 236 and the control dielectric structures 242, 244, 246, and 248.

Referring to FIGS. 3 and 4, implantation of the junction dopant at an angle in FIG. 3 for formation of the bit line junctions 232, 234, and 236 further ensures that the bit line junctions 232, 234, and 236 extend under the control dielectric structures 242, 244, 246, and 248. In addition, implantation of the predetermined species such as nitrogen at an angle in FIG. 4 further ensures that the predetermined species drifts to the interfaces between the bit line junctions 232, 234, and 236 and the control dielectric structures 242, 244, 246, and 248.

Figure 8:
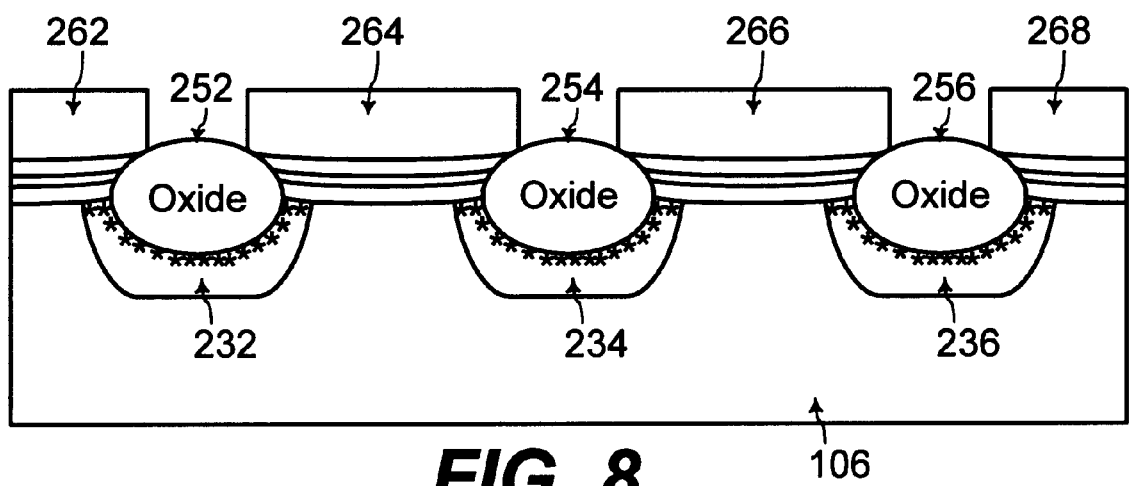

Referring to FIGS. 7 and 8, control gates comprised of polysilicon for example are formed on the control dielectric structures 242, 244, 246, and 248. A first control gate 262 is formed on the first control dielectric structure 242, a second control gate 264 is formed on the second control dielectric structure 244, a third control gate 266 is formed on the third control dielectric structure 246, and a four the control gate 268 is formed on the fourth control dielectric structure 248. Processes for forming and patterning polysilicon are known to one of ordinary skill in the art of integrated circuit fabrication.

The predetermined species such as nitrogen at the interface between the bit line junctions 232, 234, and 236 and the control dielectric structures 242, 244, 246, and 248 minimizes formation of interface defects as charge carriers are injected back and forth through such interfaces in accordance with hot carrier injection effects. In this manner, degradation of such interfaces with time is minimized during program or erase operations of a flash memory device when charge carriers are injected back and forth through such interfaces in accordance with hot carrier injection effects.

In FIG. 4, implantation processes for incorporation of the predetermined species such as nitrogen into the exposed bit line areas 212, 214, and 216 is preferred to diffusion processes because the concentration of the predetermined species such as nitrogen is more controllable with implantation processes and because a higher concentration of the predetermined species such as nitrogen may be attained with implantation processes.

The foregoing is by way of example only and is not intended to be limiting. For example, any material specified for any structure described herein is by way of example only. The present invention is limited only as defined in the following claims and equivalents thereof.

We claim:

1. A flash memory device with minimized formation of interface defects during program or erase operations of the flash memory device, the flash memory device comprising:

a first bit line junction being doped with a junction dopant within a semiconductor wafer;

a second bit line junction being doped with said junction dopant within said semiconductor wafer;

wherein said first bit line junction and said second bit line junction are separated by a control gate area within said semiconductor wafer; and a control dielectric structure formed over said control gate area of said semiconductor wafer;

wherein said first bit line junction extends under said control dielectric structure to form an interface between said first bit line junction and said control dielectric structure;

and wherein said first bit line junction has a predetermined species therein towards said interface between said first bit line junction and said control dielectric structure, and wherein said predetermined species at said interface minimizes formation of interface defects at said interface during hot carrier injection through said interface;

and wherein said predetermined species is accumulated at said interface between said first bit line junction and said control dielectric structure disposed at a surface of said semiconductor wafer and is accumulated at field oxide interfaces between said bit line junctions and field oxides disposed at said surface of said semiconductor wafer, from a thermal process.

2. The flash memory device of claim 1, wherein said predetermined species is nitrogen.

3. The flash memory device of claim 1, wherein said second bit line junction extends under said control dielectric structure to form an interface between said second bit line junction and said control dielectric structure, and wherein said second bit line junction has said predetermined species therein towards said interface between said second bit line junction and said control dielectric structure, and wherein said predetermined species at said interface minimizes formation of interface defects at said interface during hot carrier injection through said interface.

4. The flash memory device of claim 1, wherein said control dielectric structure is comprised of a first silicon dioxide ($SiO_2$) layer on said semiconductor wafer, a silicon nitride (SiN) layer on said first silicon dioxide ($SiO_2$) layer, and a second silicon dioxide ($SiO_2$) layer on said silicon nitride (SiN) layer.

5. The flash memory device of claim 1, wherein said junction dopant is comprised of one of arsenic (As) or phosphorous (P).

6. The flash memory device of claim 1, further comprising:

a first field oxide formed within the first bit line junction and a second field oxide formed within the second bit line junction, to electrically isolate said control dielectric structure.

* * * * *